United States Patent
Huang et al.

(10) Patent No.: US 7,902,644 B2
(45) Date of Patent: Mar. 8, 2011

(54) INTEGRATED CIRCUIT PACKAGE SYSTEM FOR ELECTROMAGNETIC ISOLATION

(75) Inventors: Rui Huang, Singapore (SG); Byung Tai Do, Singapore (SG); Seng Guan Chow, Singapore (SG); Heap Hoe Kuan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 464 days.

(21) Appl. No.: 11/952,951

(22) Filed: Dec. 7, 2007

(65) Prior Publication Data
US 2009/0146268 A1  Jun. 11, 2009

(51) Int. Cl.
  *H01L 23/552* (2006.01)
(52) U.S. Cl. .............. 257/660; 257/E23.114; 257/659; 438/731
(58) Field of Classification Search ........... 257/E21.506, 257/E23.114, 659, 660, 675, 676, 704, 706, 257/787, 796; 438/122, 127, 731
See application file for complete search history.

(56) References Cited

U.S. PATENT DOCUMENTS

| | | | |
|---|---|---|---|
| 5,166,772 A | 11/1992 | Soldner et al. | |
| 5,223,739 A * | 6/1993 | Katsumata et al. | 257/676 |
| 5,294,826 A * | 3/1994 | Marcantonio et al. | 257/659 |
| 5,321,204 A * | 6/1994 | Ko | 257/686 |
| 5,477,008 A * | 12/1995 | Pasqualoni et al. | 174/539 |
| 5,650,659 A * | 7/1997 | Mostafazadeh et al. | 257/660 |
| 5,656,864 A * | 8/1997 | Mitsue et al. | 257/787 |
| 5,679,975 A * | 10/1997 | Wyland et al. | 257/659 |
| 5,703,398 A * | 12/1997 | Sono et al. | 257/706 |
| 6,092,281 A | 7/2000 | Glenn | |
| 6,104,085 A * | 8/2000 | Muto et al. | 257/675 |
| 6,312,975 B1 * | 11/2001 | Brechignac et al. | 438/112 |
| 6,368,899 B1 * | 4/2002 | Featherby et al. | 438/127 |
| 6,432,742 B1 * | 8/2002 | Guan et al. | 438/106 |
| 6,603,193 B2 | 8/2003 | Crane, Jr. et al. | |
| 6,614,102 B1 * | 9/2003 | Hoffman et al. | 257/666 |
| 6,707,168 B1 | 3/2004 | Hoffman et al. | |
| 6,734,539 B2 | 5/2004 | Degani et al. | |
| 6,847,115 B2 | 1/2005 | Crane, Jr. et al. | |
| 7,187,060 B2 | 3/2007 | Usui | |
| 7,190,066 B2 * | 3/2007 | Huang et al. | 257/704 |
| 7,323,769 B2 * | 1/2008 | Tan et al. | 257/684 |
| 7,479,692 B2 * | 1/2009 | Dimaano et al. | 257/676 |
| 7,545,032 B2 * | 6/2009 | Bathan et al. | 257/690 |
| 7,576,415 B2 * | 8/2009 | Cha et al. | 257/659 |
| 7,582,951 B2 * | 9/2009 | Zhao et al. | 257/660 |
| 7,625,781 B2 * | 12/2009 | Beer | 438/122 |
| 2003/0111728 A1 * | 6/2003 | Thai et al. | 257/735 |
| 2007/0145539 A1 | 6/2007 | Lam | |
| 2009/0146269 A1 | 6/2009 | Chow et al. | |

* cited by examiner

*Primary Examiner* — Chris Chu
(74) *Attorney, Agent, or Firm* — Mikio Ishimaru (57) ABSTRACT

An integrated circuit package system comprising: providing a lead frame; forming an integrated circuit package including the lead frame; providing a selectively exposed area on the lead frame; and coating a conductive shielding layer on the integrated circuit package for coupling the selectively exposed area.

18 Claims, 5 Drawing Sheets

INTEGRATED CIRCUIT PACKAGE SYSTEM FOR ELECTROMAGNETIC ISOLATION

CROSS-REFERENCE TO RELATED APPLICATION(S)

The present application contains subject matter related to concurrently filed U.S. patent application Ser. No. 11/952,968. The related application is assigned to STATS ChipPAC Ltd.

TECHNICAL FIELD

The present invention relates generally to integrated circuit packages, and more particularly to a system for providing electromagnetic isolation between integrated circuits.

BACKGROUND ART

Modern electronic devices, for example cellular phones, personal audio/video players, hand held video games, and global positioning systems, require a seamless integration of analog and digital subsystems. Furthermore, premiums are often placed on small size, complexity, and high performance. Thus, highly sensitive analog circuits frequently need to be placed very close to high-speed digital systems.

High-speed digital systems can switch at more than one billion times a second. At such switching speeds, switching currents tend to be high. Thus, such high-speed digital systems can radiate energy that interferes with highly sensitive analog circuits. Interference usually takes the form of signal crosstalk. While faraday shielding has been widely used to protect highly sensitive analog circuits from interference, the traditional faraday shields tend to be expensive both in space and labor content. Furthermore, their implementation must be undertaken with great foresight to determine where to install the shields, and with great care to actually protect the analog circuits. Moreover, the traditional faraday shield is not particularly flexible.

Traditionally, an integrated circuit is supplied as part of a semiconductor package having external leads for soldering, or otherwise connecting, to a printed circuit board. For example, surface mount leadless packages have been widely used with integrated circuit chips. In such packages, an integrated circuit chip is encapsulated in a ceramic or plastic housing having electrical leads that are suitable for soldering to a circuit board. Bonding conductors, which are also encapsulated in the housing, extend from the upper part of the electrical leads, which are within the package, to electrical pads on the integrated circuit chip.

A typical prior art semiconductor package includes a lead frame, which is usually stamped out of a metal strip. The lead frame may include a plurality of leads held together by connectors that extend between the leads. The lead frame may further include a mounting pad.

Typically, the bond conductors are welded to the electrical leads and to the electrical pads. Next the lead frame, the integrated circuit chip, and the bonding conductors are then encapsulated. Finally the leads are cut and formed as required to complete the semiconductor package.

Because of the demand for high-density packaging, surface mount leadless packages have become popular. However, denser packaging increases the cross-talk problem. Furthermore, many analog circuits have a high impedance level that makes them particularly sensitive to crosstalk. So, while useful, most surface mount leadless packages provide inadequate electrical and electromagnetic isolation of their components.

Another type of semiconductor package, one that is a hybrid of the surface mount leadless package and a "pin-type" package, is possible. Such a semiconductor package has "pins" that extend from the bottom of the package. Those pins are designed to attach to pads on the surface of a printed circuit board. As electrical connections are not made along the edges of the package, adjacent semiconductor packages can abut, which allows dense packaging. While beneficial, this also increases the cross-talk problem.

Thus, a need still remains for integrated circuit package system that provides electrical and electromagnetic isolation of a component mounted therein. More beneficial would be a low cost semiconductor package that enables dense packaging of integrated circuit chips, together with electrical and electromagnetic isolation of those chips. In view of the increasing demand for small and highly integrated electronic devices, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system comprising: providing a lead frame; forming an integrated circuit package including the lead frame; providing a selectively exposed area on the lead frame; and applying a conductive shielding layer on the integrated circuit package for coupling the selectively exposed area.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Figure 1:
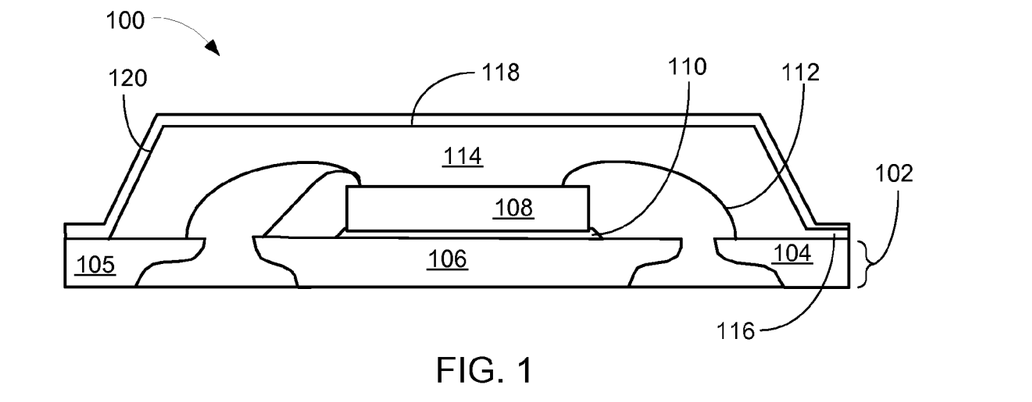
FIG. 1 is a first cross-sectional view of an integrated circuit package system for electromagnet isolation, in an embodiment of the present invention.

Referring now to FIG. 1, therein is shown a first cross-sectional view of an integrated circuit package system 100 for electromagnet isolation, in an embodiment of the present invention. The first cross-sectional view of the integrated circuit package system 100 depicts a lead frame 102 having a leadfinger 104 and a die attach pad 106. An integrated circuit 108 may be mechanically coupled to the die attach pad 106 by an adhesive 110, such as a die attach material.

Electrical interconnects 112, such as bond wires, may electrically connect the lead, 104, the die attach pad 106, the integrated circuit 108, or a combination thereof. An insulating compound 114, such as an epoxy molding compound, may be formed around the lead frame 102, the integrated circuit 108 and the electrical interconnects 112. An insulation step 116 may be formed over the leads 104 of the lead frame 102 for isolating a signal from the integrated circuit 108. A selectively exposed lead 105 that does not have the insulation step 116 covering the leadfinger 104 may be formed by blocking the insulating compound 114.

A conductive shielding layer 118, such as a conductive resin, a metal, a conductive foil, or a conductive film, may be coated on the insulating compound 114. The conductive shielding layer 118 may be formed of a two component epoxy containing silver, copper, nickel, an alloy, or other metal. The conductive shielding layer 118 may also be formed of a nickel filled polyurethane or acrylic coating. The insulation step 116 may prevent the conductive shielding layer 118 from forming an electrical connection among the leads 104. The conductive shielding layer 118 may form an electrical connection to the selectively exposed lead 105, that do not have the insulation step 116 covering the leadfinger 104, for coupling a voltage, such as $V_{SS}$ or Ground, to the conductive shielding layer 118.

The conductive shielding layer 118 may be applied by known methods, such as plating, sputtering, spraying, painting, rolling, or laminating. The conductive shielding layer 118 may be applied over all of the surfaces of the insulating compound 114, including a lateral side 120, and any of the leads 104 that may remain exposed.

It has been discovered that, by selectively exposing certain of the leads 104 during the forming of the insulating compound 114, the conductive shielding layer 118 will electrically connect to only those of the leads 104 that are left exposed. This may greatly simplify the application and reliability of the conductive shielding layer 118. By forming an electrical connection between the conductive shielding layer 118 and any of the leads 104 that are coupled to the voltage, such as $V_{SS}$ or ground, the conductive shielding layer 118 will also be coupled to the voltage. By coupling the conductive shielding layer 118 to the voltage, the conductive shielding layer 118 will isolate the integrated circuit 108 from any electromagnetic interference that may be present outside the conductive shielding layer 118. The conductive shielding layer 118 may also be used to prevent any electromagnetic interference generated by the integrated circuit 108 from escaping into the system environment beyond the conductive shielding layer 118, thus providing electromagnetic isolation to the system environment.

Figure 2:
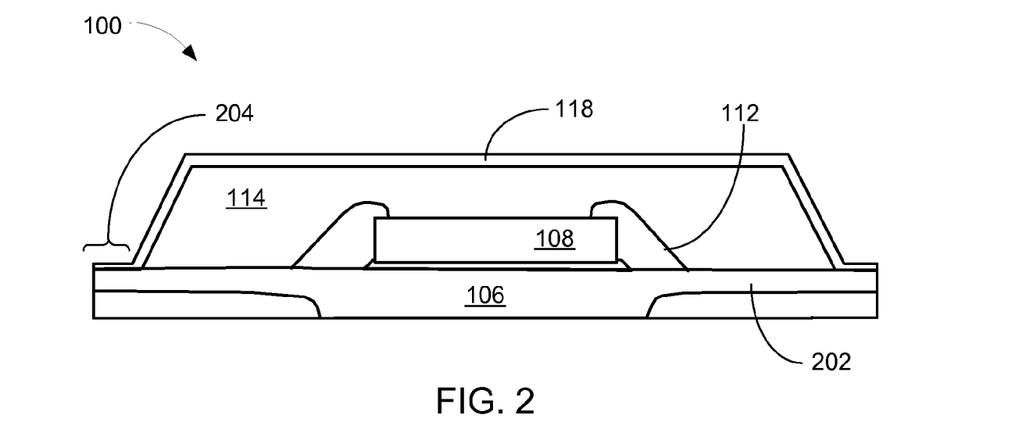
FIG. 2 is a second cross-sectional view of the integrated circuit package system for electromagnet isolation, in an embodiment of the present invention.

Referring now to FIG. 2, therein is shown a second cross-sectional view of the integrated circuit package system 100 for electromagnet isolation, in an embodiment of the present invention. The second cross-sectional view of the integrated circuit package system 100 depicts the lead frame 102 having the die attach pad 106 with tie bars 202 extending therefrom. The tie bars 202 may be electrically connected to the integrated circuit 108 by the electrical interconnects 112. The insulating compound 114 may be formed on the die attach pad 106, the integrated circuit 108, the electrical interconnects 112, and the tie bars 202. An end surface 204 of the tie bars 202 may selectively remain exposed and therefore is not covered by the insulating compound 114. The application of the conductive shielding layer 118 will form an electrical connection to the end surface 204 of the tie bars 202.

Figure 3:
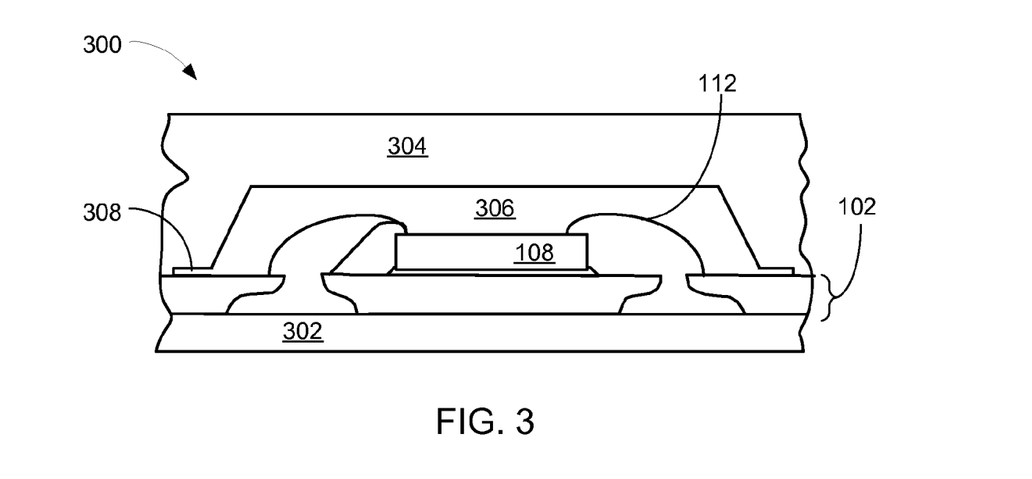
FIG. 3 is a first cross-sectional view of a package mold for implementing the present invention.

Referring now to FIG. 3, therein is shown a first cross-sectional view of a package mold 300 for implementing the present invention. The first cross-sectional view of the package mold 300 depicts a mold base 302 with the lead frame 102 positioned thereon. The integrated circuit 108 may be mounted on the lead frame 102 with the electrical interconnects 112 coupling the integrated circuit 108 to the lead frame 102.

A mold chase 304, having a cavity 306, may clamp the lead frame 102 in position for a molding process. The cavity 306 may have an open volume around the integrated circuit 108 and the electrical interconnects 112. A mold step 308 may be formed over the lead frame 102 and open into the cavity 306.

Figure 4:
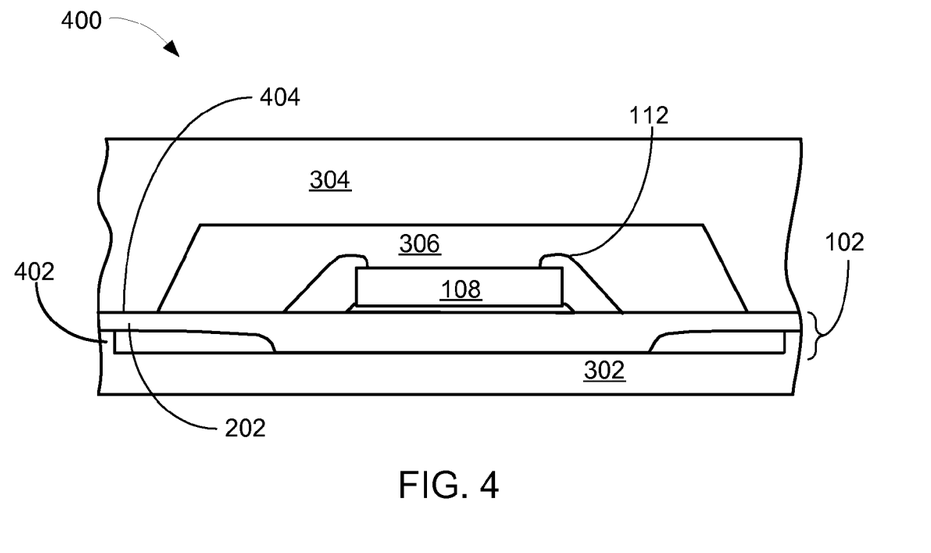
FIG. 4 is a second cross-sectional view of the package mold.

Referring now to FIG. 4, therein is shown a second cross-sectional view of the package mold 300. The second cross-sectional view of the package mold 300 depicts the mold base 302 having an end gate 402 for forming a package base around the tie bar 202. The integrated circuit 108 may be mounted on the lead frame 102 with the electrical interconnects 112 coupling the integrated circuit 108 to the lead frame 102.

The mold chase 304, having the cavity 306, may clamp the lead frame 102 in position for the molding process. The cavity 306 may have an open volume around the integrated circuit 108 and the electrical interconnects 112. The cavity 306 does not extend over the entire surface of the tie bars 202. This configuration provides a selectively exposed area 404 on the tie bars 202.

Figure 5:
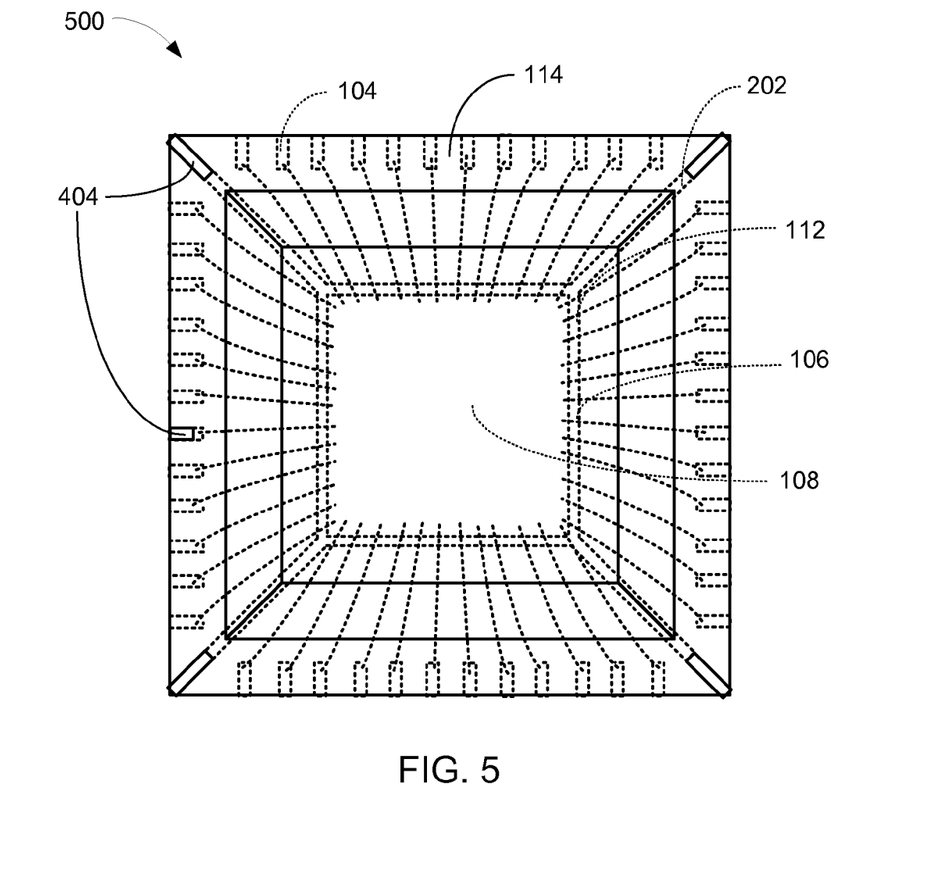
FIG. 5 is a top plan view of an integrated circuit package, in an embodiment of the present invention.

Referring now to FIG. 5, therein is shown a top plan view of an integrated circuit package 500, in an embodiment of the present invention. The top plan view of the integrated circuit package 500 depicts the leads 104, the die attach pad 106, the integrated circuit 108, the electrical interconnects 112, and the tie bars 202 substantially encased by the insulating compound 114.

The selectively exposed area 404 may be formed on the tie bars 202 or on the leads 104 in a selected location or locations by blocking the insulating compound 114 during the molding of the integrated circuit package 500. The selectively exposed area 404 may be available for contacting the conductive shielding layer 118, of FIG. 1, in a subsequent manufacturing process.

Figure 6:
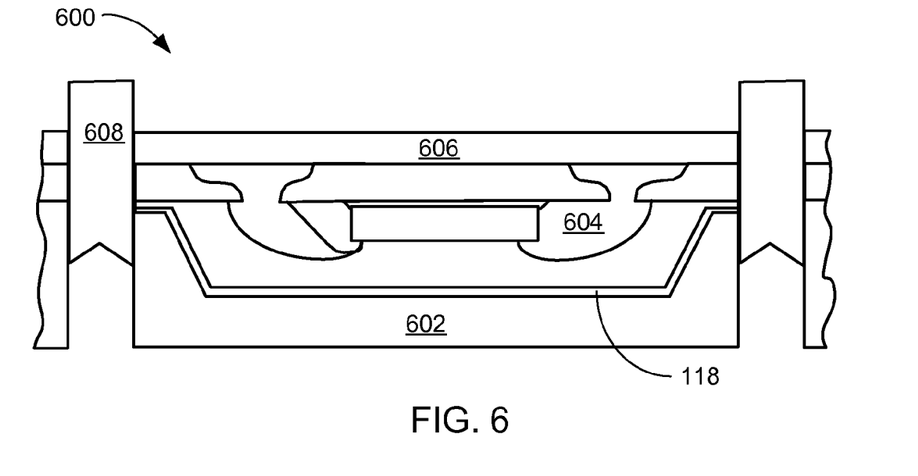
FIG. 6 is a cross-sectional view of a singulation apparatus for the present invention.

Referring now to FIG. 6, therein is shown a cross-sectional view of a singulation apparatus 600 for the present invention. The cross-sectional view of the singulation apparatus 600 depicts a shear base 602 for supporting a shielded package 604. A shear top 606 may be used to align and stabilize a punch 608 that may perform the singulation of the shielded package 604.

The singulation apparatus 600 is an example only. The singulation process may include a saw or a shear in place of the punch 608. The shielded package 604 is singulated so that the conductive shielding layer 118 is connected only to the selectively exposed areas 404, of FIG. 4.

Figure 7:
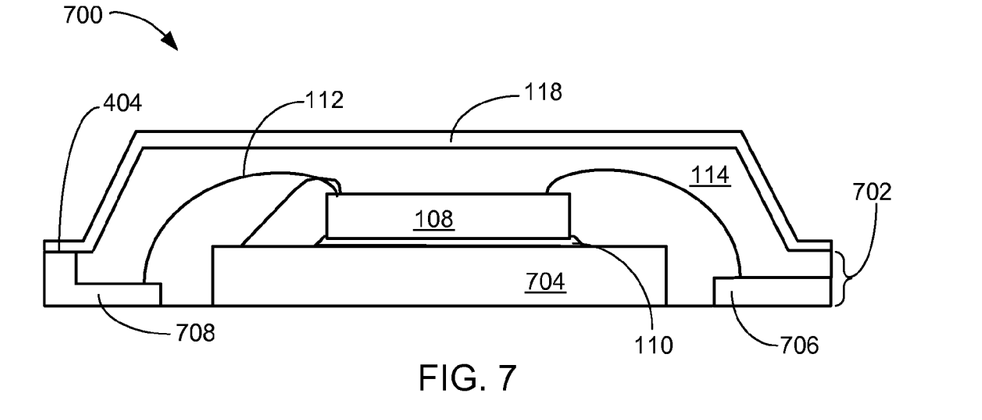
FIG. 7 is a cross-sectional view of an integrated circuit package system for electromagnet isolation, in a first alternative embodiment of the present invention.

Referring now to FIG. 7, therein is shown a cross-sectional view of an integrated circuit package system 700 for electromagnet isolation, in a first alternative embodiment of the present invention. The cross-sectional view of the integrated circuit package system 700 depicts a lead frame 702 having a die attach pad 704, a signal lead 706 and a stepped lead 708. The stepped lead 708 may be selectively formed at any position around the integrated circuit package system 700. The integrated circuit 108 may be attached to the die attach pad 704 by the adhesive 110. The electrical interconnects 112 may be coupled between the integrated circuit 108, the die attach pad 704, the signal lead 706, the stepped lead 708, or a combination thereof.

The insulating compound 114 may be formed on the integrated circuit 108, the die attach pad 704, the signal lead 706, and the stepped lead 708. The stepped lead 708 may provide the selectively exposed areas 404 for coupling the conductive shielding layer 118. By connecting the stepped lead 708 to the voltage, such as $V_{SS}$ or Ground, the conductive shielding layer 118 will provide isolation from electromagnetic interference.

Figure 8:
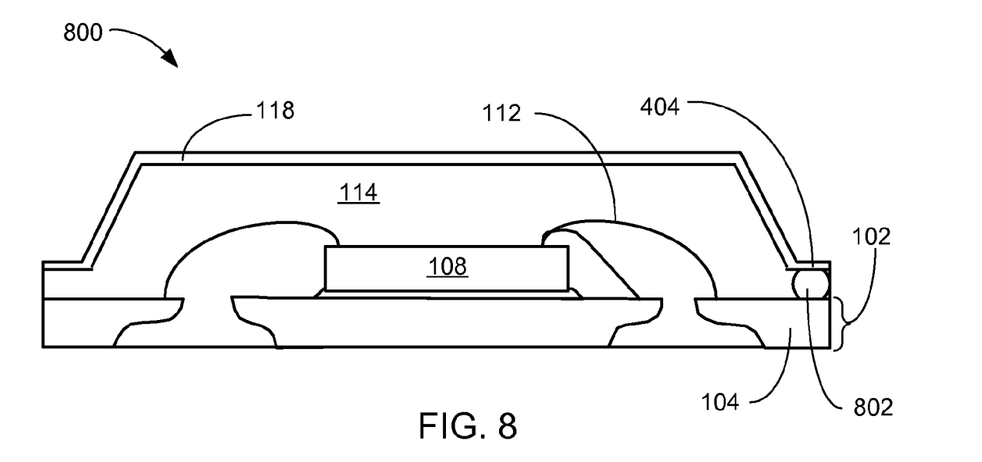
FIG. 8 is a cross-sectional view of an integrated circuit package system for electromagnet isolation, in a second alternative embodiment of the present invention.

Referring now to FIG. 8, therein is shown a cross-sectional view of an integrated circuit package system 800 for electromagnet isolation, in a second alternative embodiment of the present invention. The cross-sectional view of the integrated circuit package system 800 depicts the lead frame 102 with the integrated circuit 108 mounted thereon. The electrical interconnects 112 may couple the lead frame 102 to the integrated circuit 108. A conductive bead 802, such as a metal ball, a metal bump, a stud bump, a metal column, or a conductive resin, may be coupled to the leads 104 in selective locations.

The insulating compound 114 may be formed on the lead frame 102, the integrated circuit 108, the electrical interconnects 112, and the conductive bead 802. A portion of the conductive bead 802 may protrude from the insulating compound 114 for providing the selectively exposed area 404. The conductive bead 802 may be coupled to the leadfinger 104 for providing the voltage, such as $V_{SS}$ or Ground. By applying the conductive shielding layer 118 on the insulating compound 114 and the selectively exposed area 404, the integrated circuit 108 may be isolated from electromagnetic interference.

Figure 9:
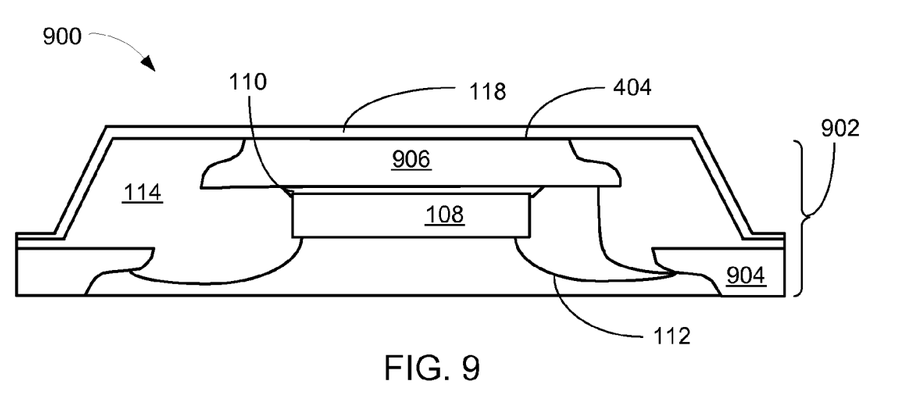
FIG. 9 is a cross-sectional view of an integrated circuit package system for electromagnet isolation, in a third alternative embodiment of the present invention.

Referring now to FIG. 9, therein is shown a cross-sectional view of an integrated circuit package system 900 for electromagnet isolation, in a third alternative embodiment of the present invention. The cross-sectional view of the integrated circuit package system 900 depicts a lead frame 902 having leadfingers 904 and an inverted die attach pad 906. The integrated circuit 108 may be mounted on the inverted die attach pad 906 by the adhesive 110. The electrical interconnects 112 may be coupled between the leadfingers 904, the inverted die attach pad 906, the integrated circuit 108, or a combination thereof.

The insulating compound 114 may be applied on the leadfingers 904, the inverted die attach pad 906, the integrated circuit 108, and the electrical interconnects 112. The top portion of the inverted die attach pad 906 may protrude through the insulating compound 114 to form the selectively exposed area 404. The conductive shielding layer 118 may be applied on the insulating compound 114 and the selectively exposed areas 404. The inverted die attach pad 906 may be connected to the voltage through the tie bar 202 of FIG. 2, the electrical interconnects 112, the leadfingers 904, or a combination thereof.

Figure 10:
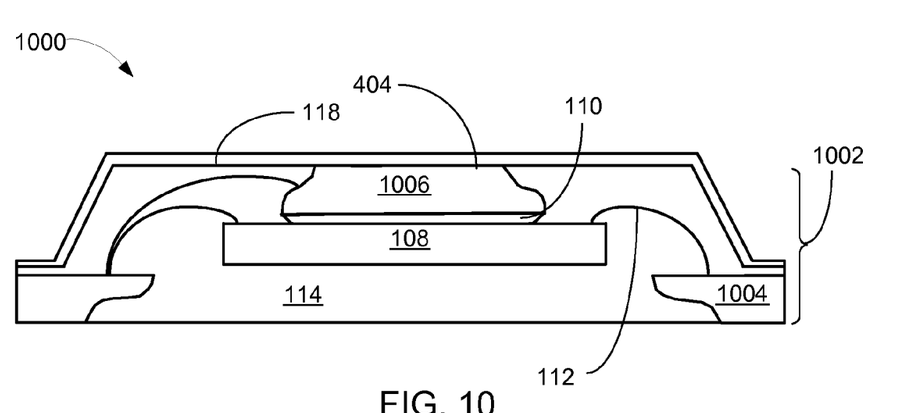
FIG. 10 is a cross-sectional view of an integrated circuit package system for electromagnet isolation, in a fourth alternative embodiment of the present invention.

Referring now to FIG. 10, therein is shown a cross-sectional view of an integrated circuit package system 1000 for electromagnet isolation, in a fourth alternative embodiment of the present invention. The cross-sectional view of the integrated circuit package system 1000 depicts a lead frame 1002 having leads 1004 and an inverted die attach pad 1006. The integrated circuit 108 may be mounted on the inverted die attach pad 1006 by the adhesive 110. The integrated circuit 108 that may be larger than the inverted die attach pad 1006 can be mounted with an active side facing the inverted die attach pad 1006. The electrical interconnects 112 may be coupled between the leads 1004, the inverted die attach pad 1006, the integrated circuit 108, or a combination thereof.

The insulating compound 114 may be applied on the leads 1004, the inverted die attach pad 1006, the integrated circuit 108, and the electrical interconnects 112. The top portion of the inverted die attach pad 1006 may protrude through the insulating compound 114 to form the selectively exposed area 404. The conductive shielding layer 118 may be applied on the insulating compound 114 and the selectively exposed areas 404. The inverted die attach pad 1006 may be connected to the voltage through the tie bar 202 of FIG. 2, the electrical interconnects 112, the leads 1004, or a combination thereof.

It has been unexpectedly discovered that the inverted die attach pad 1006 may provide a cooling path for the integrated circuit package system 1000. The conductive shielding layer 118 may also provide a radiant cooling heat sink as well as electromagnetic isolation.

Figure 11:
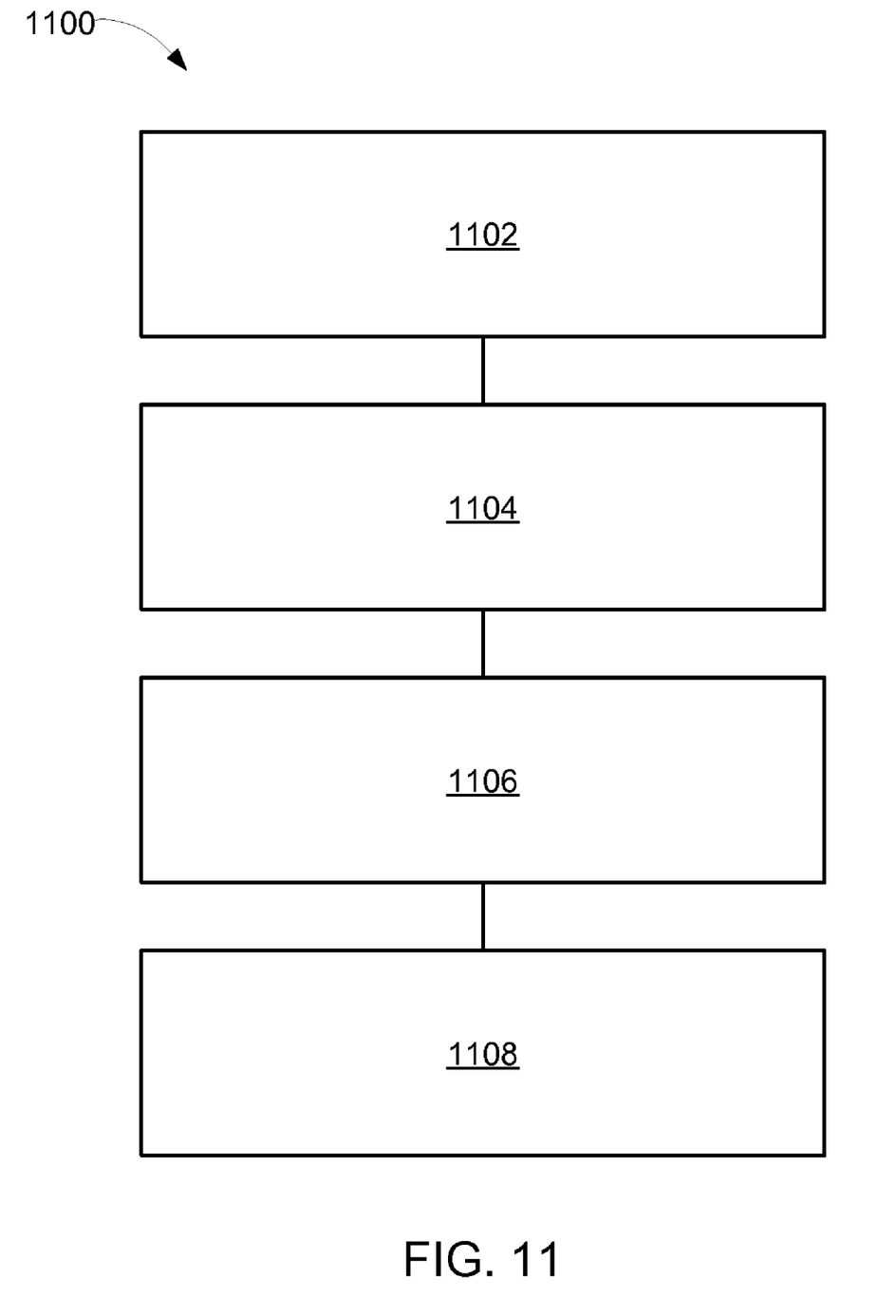
FIG. 11 is a flow chart of an integrated circuit package system for manufacturing the integrated circuit package system for electromagnetic isolation, in an embodiment of the present invention.

Referring now to FIG. 11, therein is shown a flow chart of an integrated circuit package system 1100 for manufacturing the integrated circuit package system 100 in an embodiment of the present invention. The system 1100 includes providing a lead frame in a block 1102; forming an integrated circuit package including the lead frame in a block 1104; providing a selectively exposed area on the lead frame in a block 1106; and coating a conductive shielding layer on the integrated circuit package for coupling the selectively exposed area in a block 1108.

It has been discovered that the present invention thus has numerous aspects.

A principle aspect that has been unexpectedly discovered is that the present invention may provide a thermal sinking mechanism while providing electromagnetic isolation.

Another aspect is the present invention utilizes only standard package assembly processes, yet is extremely reliable. There is minimal thickness added to the finished package and no additional horizontal space required to implement the present invention.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for providing electromagnetic isolation for integrated circuit packages. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing a lead frame;
   forming an integrated circuit package including the lead frame;
   providing a selectively exposed area on the lead frame; and
   coating a conductive shielding layer on the integrated circuit package for coupling the selectively exposed area by applying a two-component epoxy, acrylic, or urethane having a suspension of silver, copper, nickel, a metal alloy, or a combination thereof.

2. The method as claimed in claim 1 wherein forming the integrated circuit package includes:
   providing a leadfinger in the lead frame; and
   forming an insulation step on the leadfinger for insulating the leadfinger from the conductive shielding layer.

3. The method as claimed in claim 1 wherein providing the lead frame includes forming a die attach pad on the lead frame for providing the selectively exposed area.

4. The method as claimed in claim 1 in which forming the integrated circuit package includes molding an insulating compound on the lead frame having an inverted die attach pad.

5. The method as claimed in claim 1 wherein providing the selectively exposed area includes providing a selectively exposed lead, a stepped lead, a conductive bead, an inverted die attach pad, a tie bar selectively exposed, or a combination thereof.

6. A method of manufacture of an integrated circuit package system comprising:
   providing a lead frame having a leadfinger;
   forming an integrated circuit package including the lead frame by molding an insulating compound;
   providing a selectively exposed area on the leadfinger by blocking a selectively exposed lead from the insulating compound;
   coating a conductive shielding layer on the integrated circuit package for coupling the selectively exposed area including electrically coupling the selectively exposed lead by applying a two-component epoxy, acrylic, or urethane having a suspension of silver, cooper, nickel, a metal alloy, or a combination thereof; and
   singulating an integrated circuit package system from the lead frame.

7. The method as claimed in claim 6 wherein forming the integrated circuit package includes:
   coupling an integrated circuit to the leadfinger; and
   forming an insulation step on the leadfinger for insulating the leadfinger from the conductive shielding layer including isolating a signal lead from the conductive shielding layer.

8. The method as claimed in claim 6 wherein providing the lead frame includes forming a die attach pad on the lead frame for providing the selectively exposed area including extending a tie bar from the die attach pad.

9. The method as claimed in claim 6 in which forming the integrated circuit package includes molding the insulating compound on the lead frame having an inverted die attach pad including bonding an electrical interconnect between the inverted die attach pad, a leadfinger, an integrated circuit, or a combination thereof.

10. An integrated circuit package system comprising:
    a leadfinger singulated from a lead frame;
    an integrated circuit package includes the leadfinger;
    a selectively exposed area on the leadfinger; and
    a conductive shielding layer, on the integrated circuit package, coupled to the selectively exposed area includes a two-component epoxy, acrylic, or urethane with a suspension of silver, copper, nickel, a metal alloy, or a combination thereof.

11. The system as claimed in claim 10 wherein the integrated circuit package includes an insulation step formed on the leadfinger for insulating the leadfinger from the conductive shielding layer.

12. The system as claimed in claim 10 further comprising a die attach pad in the integrated circuit package for providing the selectively exposed area.

13. The system as claimed in claim 10 in which the integrated circuit package includes an insulating compound on an inverted die attach pad and the leadfinger.

14. The system as claimed in claim 10 wherein the selectively exposed area includes a selectively exposed lead, a stepped lead, a conductive bead, an inverted die attach pad, a tie bar selectively exposed, or a combination thereof.

15. The system as claimed in claim 10 further comprising:
a selectively exposed lead formed on the integrated circuit package by an insulating compound blocked; and
wherein:
the selectively exposed lead coupled to the conductive shielding layer.

16. The system as claimed in claim 15 wherein the integrated circuit package includes:
an integrated circuit coupled to the leadfinger; and
an insulation step formed on the leadfinger to insulate the leadfinger from the conductive shielding layer for isolating a signal lead from the conductive shielding layer.

17. The system as claimed in claim 15 wherein the integrated circuit package includes: a die attach pad for providing the selectively exposed area including extending a tie bar from the die attach pad.

18. The system as claimed in claim 15 in which the integrated circuit package includes an inverted die attach pad including an electrical interconnect bonded between the inverted die attach pad, a leadfinger, an integrated circuit, or a combination thereof.

* * * * *